United States Patent [19]

Iizuka

[11] Patent Number: 5,172,206
[45] Date of Patent: Dec. 15, 1992

[54] SOLID STATE IMAGE PICKUP DEVICE WITH MIRRORS

[75] Inventor: Yasuo Iizuka, Yokohama, Japan
[73] Assignee: Kabushiki Kaisha Toshiba, Kawasaki, Japan
[21] Appl. No.: 738,094
[22] Filed: Jul. 30, 1991
[30] Foreign Application Priority Data Jul. 30, 1990 [JP] Japan .................. 2-201681

[51] Int. Cl.$^5$ ............................................ H01L 27/14
[52] U.S. Cl. ................................ 257/291; 257/435; 257/436; 257/448; 257/294
[58] Field of Search ............... 357/30 L, 30 H, 30 P, 357/30 D, 30 G, 30 R, 30 K, 32, 68, 4, 24

[56] References Cited

U.S. PATENT DOCUMENTS

| 4,745,451 | 5/1988 | Webb et al. | 357/30 H |
| 5,061,978 | 1/1991 | Mizutani et al. | 357/32 X |

FOREIGN PATENT DOCUMENTS

| 59-141277 | 8/1984 | Japan | 357/30 L |
| 62-12154 | 1/1987 | Japan | 357/30 L |
| 0269978 | 3/1990 | Japan | 357/30 L |

*Primary Examiner*—William Mintel
*Attorney, Agent, or Firm*—Foley & Lardner

[57] ABSTRACT

There is provided a solid state image pickup device, comprising: a semiconductor substrate; a plurality of photosensitive elements formed on the surface of the semiconductor substrate; light shielding elements positioned above the substrate for covering the regions other than the photosensitive elements; a plurality of light converging elements each for converging an incident light to each of the photosensitive elements, the light converging elements being formed above the photosensitive elements at the level above the light shielding elements at a predetermined pitch; and reflecting elements formed between non-lens regions between the light converging elements and the light shielding elements, the reflecting elements each having a reflection surface for reflecting a light incident to the converging means and the non-lens regions or at least a light incident to the non-lens region toward the photosensitive element.

22 Claims, 10 Drawing Sheets

SOLID STATE IMAGE PICKUP DEVICE WITH MIRRORS

FIELD OF THE INVENTION

The present invention relates to a solid state image pickup device, and a method of manufacturing the same.

BACKGROUND OF THE INVENTION

Figure 1:
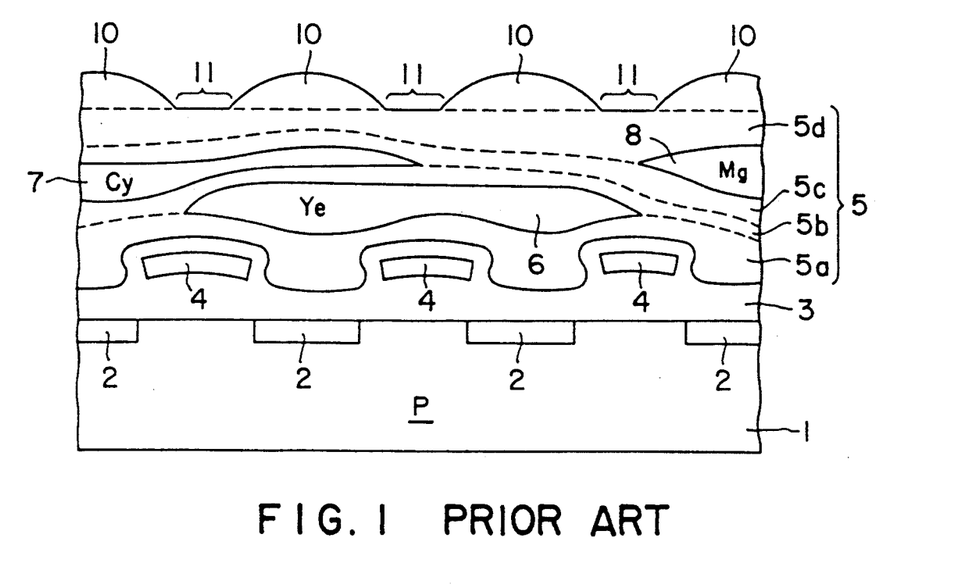
FIG. 1 is a cross sectional view showing the main part of a conventional image pickup device.

FIG. 1 is a cross sectional view of a conventional solid state image pickup device. Photosensitive elements (photodiodes) 2, 2, ... of the image pickup device are formed by diffusing N-type impurities on the surface of a P-type silicon substrate 1. The surface of the substrate 1 is covered with an insulating protective film 3 such as a PSG film, plasma SiN film, or the like. Light shielding films 4, 4, ... made of Al (aluminum) are formed in the protective film 3 above the regions between photodiodes 2 and 2. The protective film 3 is further covered with another protective film 5. There are formed in the protective film 3 color layers including Ye (yellow) layers 6, Cy (cyan) layers 7, and Mg (magenta) layers 8. These color layers are formed in the following manner. First, a protective film 5a is formed on the protective film 3. Water soluble transparent resist (e.g. FCR500, a product name of Fuji Yakuhin Kabushiki Kaisha) is coated on the surface of the protective film 5a. The resist film is then etched while leaving a pattern (6), by using an etching liquid made of gelatin or casein with 1 weight % ammonium dichromate being added. The remaining pattern (6) is dyed with an Ye acid dyeing liquid, to form the Ye layers 6. Thereafter, a protective film 5b is formed and water soluble transparent resist is coated on the surface of the protective film 5b. The resist layer is etched while leaving a pattern (7) in a similar manner as above. The remaining pattern (7) is dyed with a Cy acid dyeing liquid to form the Cy layers 7. Thereafter, a protective film 5c is formed and water soluble transparent resist is coated on the surface of the protective film 5c. The resist layer is etched while leaving a pattern (8) in the similar manner as above. The remaining pattern (8) is dyed with an Mg acid dyeing liquid to form the Mg layers 8. Thereafter, a smoothing layer 5d is formed using oil soluble transparent resist. In the above manner, three color layers 7 to 9 are formed above the photodiodes 2, 2, ...

Micro lenses 10, 10, ... are formed on the smoothing layer 5d at the positions just above the photodiodes 2, 2, .... The lenses are formed by using any one of various known methods.

If micro lenses 10, 10, ... are formed using a conventional method, spaces are essentially formed between the lenses 10, 10, ... In other words, there exist non-lens regions 11, 11, ... Light beams incident to the non-lens regions become stray light beams and cause the smear phenomenon to be described later. Light beams incident to the non-lens region are not efficiently used as image pickup signals, thereby lowering an aperture efficiency. It is therefore inevitable that the sensitivity of the image pickup device is degraded. Moreover, the light beams obliquely incident to the micro lens 10 become stray light beam similarly to those light beams incident to the non-lens regions 11, thereby causing the smear phenomenon and degrading the sensitivity.

SUMMARY OF THE INVENTION

The present invention has been made in consideration of the above circumstances. It is an object of the present invention to provide a solid state image pickup device capable of suppressing the smear phenomenon and having a high sensitivity, by correctly applying light beams incident not only to micro lenses but also non-lens regions, to photodiodes.

According to one aspect of the present invention, there is provided a solid state image pickup device, having:

a semiconductor substrate;

a plurality of photosensitive means formed on the surface of the semiconductor substrate;

light shielding means positioned above the substrate for covering the regions other than the photosensitive means;

a plurality of light converging means each for converging an incident light to each of the photosensitive means, the light converging means being formed above the photosensitive means at the level above the light shielding means at a predetermined pitch; and reflecting means formed between non-lens regions between the light converging means and the light shielding means, the reflecting means having a reflection surface for reflecting a light incident to the converging means and the non-lens regions toward the photosensitive means.

According to another aspect of the present invention, there is provided a solid state image pickup device, having:

a semiconductor substrate;

a plurality of photosensitive means formed on the surface of the semiconductor substrate;

light shielding means positioned above the substrate for covering the regions other than the photosensitive means;

a plurality of light converging means each for converging an incident light to each of the photosensitive means, the light converging means being formed above the photosensitive means at the level above the light shielding means at a predetermined pitch; and reflecting means formed between non-lens regions between the light converging means and the light shielding means, the reflecting means having a reflection surface for reflecting at least a light incident to the non-lens regions toward the photosensitive means.

According to yet another aspect of the present invention, there is provided a method of manufacturing a solid state image pickup device by:

covering the surface of a semiconductor substrate with a protective film, a plurality of photosensitive means being formed on the surface of the semiconductor substrate at a predetermined pitch;

forming an aluminum film on the protective film;

patterning the aluminum layer to form reflecting means having a reflection surface for reflecting a light incident to the reflection surface toward each of the photosensitive means; and forming light converging means above each of the photosensitive means, the light converging means converging an incident light to each of the photosensitive means.

According to still another aspect of the present invention, there is provided a method of manufacturing a solid state image pickup device by:

covering the surface of a semiconductor substrate with an insulating film, a plurality of photosensitive means being formed on the surface of the semiconductor substrate at a predetermined pitch;

patterning the insulating film to leave predetermined regions above each of the photosensitive means, each of the predetermined regions being used as a core of reflecting means for reflecting a light incident to the reflecting means toward each of the photosensitive means; and covering an aluminum film on the surface of the predetermined regions to form the reflecting means.

DESCRIPTION OF THE PREFERRED EMBODIMENTS

Figure 2:
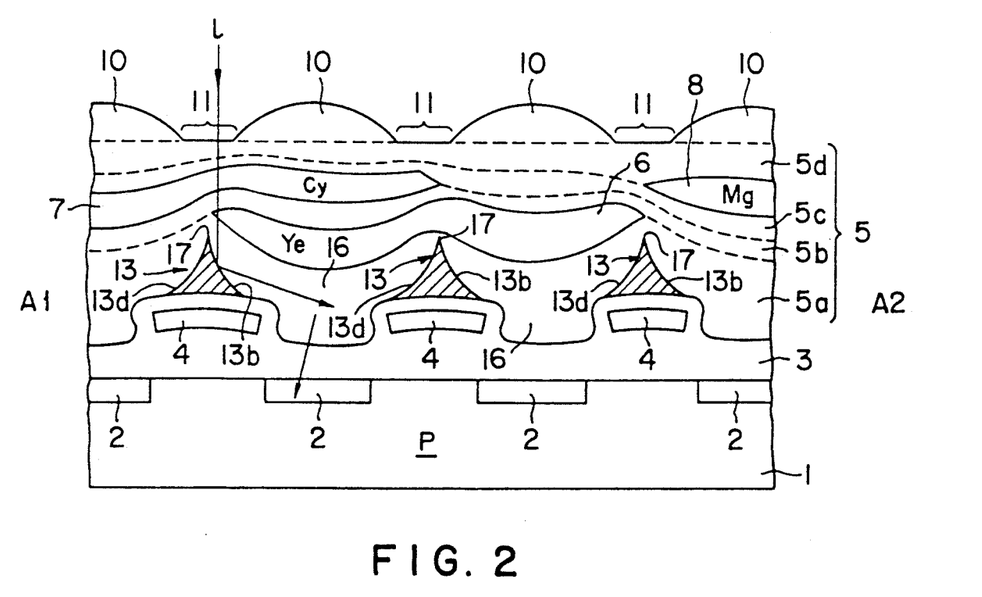
FIG. 2 is a cross sectional view showing the main part of an image pickup device according to an embodiment of the present invention, the cross sectional view being taken along line A1-A2 shown in FIG. 4.

FIG. 2 shows an embodiment of the image pickup device according to the present invention. In FIG. 2, like elements to those shown in FIG. 1 are represented by using identical reference numerals. A different feature of the embodiment shown in FIG. 2 from the conventional image pickup device shown in FIG. 1 is that mirrors 13 are formed under the non-lens regions 11, each mirror 13 being made of Al and having a cross section of generally a wedge shape. The mirror 13 has reflection surfaces on both sides of the wedge. Light beams 1 incident to the non-lens region 11 and light beams obliquely incident to the lens 10 are applied to a corresponding one of the corresponding photodiodes 2.

Figure 4:
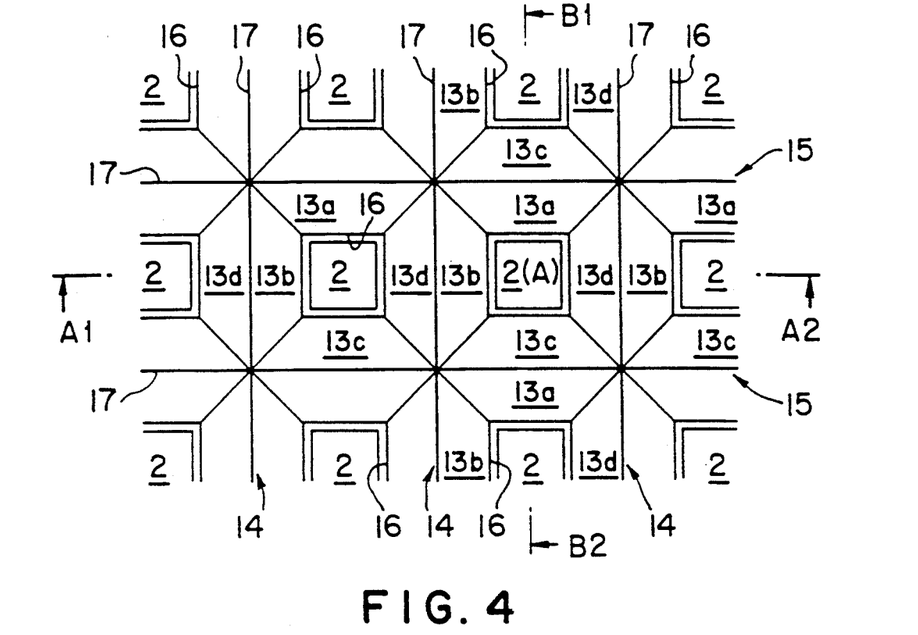
FIG. 4 is a plan view showing the main part of a pattern of the image pickup device of the embodiment.
Figure 5:
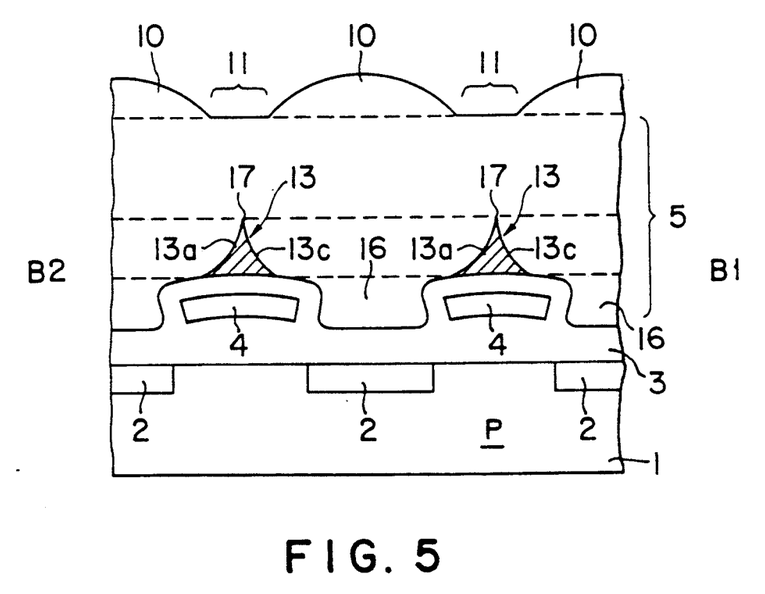
FIG. 5 is a cross sectional view taken along line B1-B2 of FIG. 4.

The configuration of the mirror 13 will be described in more detail. As seen from FIG. 4, mirrors 13 are collectively formed such that a plurality of holes 16, 16, . . . are provided in a matrix shape as viewed on a flat plane of the device. FIG. 4 is a plan pattern diagram showing the relationship between mirrors 13 and photodiodes 2 of this embodiment. The cross section taken along line A1-A2 of FIG. 1 corresponds to FIG. 1, and the cross section taken along line B1-B2 corresponds to FIG. 5. As seen particularly from FIG. 4, mirrors 13 have vertical elements 14, 14, . . . and horizontal elements 15, 15, . . . , and have square holes 16, 16, . . . surrounded by the mirrors 13. The cross section of each of the vertical and horizontal elements 14 and 15 is generally of a wedge shape as seen from FIGS. 2 and 5. The surfaces on both sides of the peak 17 of each wedge are concave. The surfaces are not necessary to be concave, but they may be flat. As seen particularly from FIG. 4, consider one photodiode 2(A). Light beams incident to the four concave surfaces 13a to 13d surrounding the photodiode 2(A) are reflected and become incident to the photodiode 2(A). Therefore, not only light beams incident to the micro lens 10 but also light beams incident to the non-lens region 11 and obliquely incident to the lens 10 and reflected by the concave surfaces 13a to 13d, become incident to the photodiode 2. In this manner, the light convergence factor of incident light beams is considerably improved, for example, allowing a light convergence factor very near to 100%. Namely, the apparent aperture efficiency becomes near 100%, improving, the sensitivity. Furthermore, thereby are not generated stray light beams, thus sufficiently suppressing the smear phenomenon.

Next, a method of manufacturing the image pickup device shown in FIG. 2 will be described.

Figure 3A:
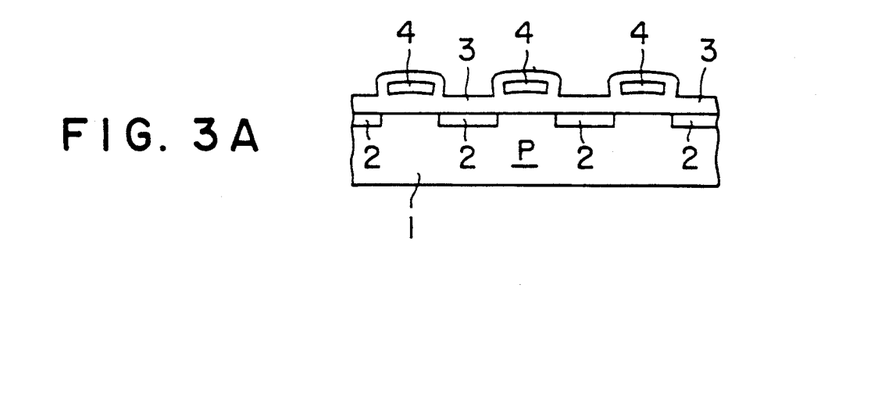
FIGS. 3A to 3F are cross sectional views showing examples of processes for manufacturing the image pickup device of the embodiment.

FIG. 3A shows an image pickup device at the intermediate process of the manufacturing method, the image pickup device at this stage being similar to a conventional image pickup device. Namely, photosensitive elements (photodiodes) 2 are formed on the surface of a P-type semiconductor substrate 1. The surface of the substrate 1 is covered with an insulating protective film 3 such as a PSG film, plasma SiN film, or the like. There are formed light shielding films 4, 4, . . . made of Al or the like within the protective film 3.

Figure 3B:
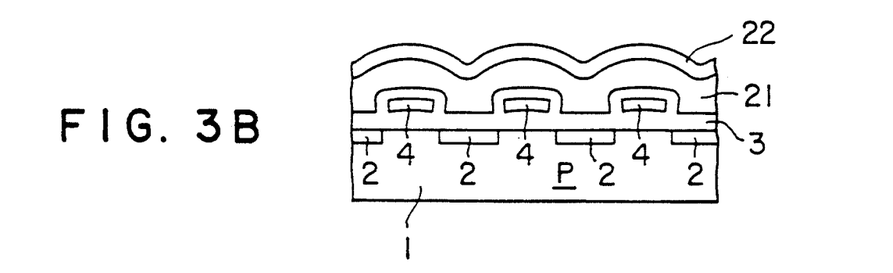

Next, as shown in FIG. 3B, a second Al film 21 is deposited on the protective film 3. A photoresist layer 22 is deposited on the Al film 21.

Figure 3C:
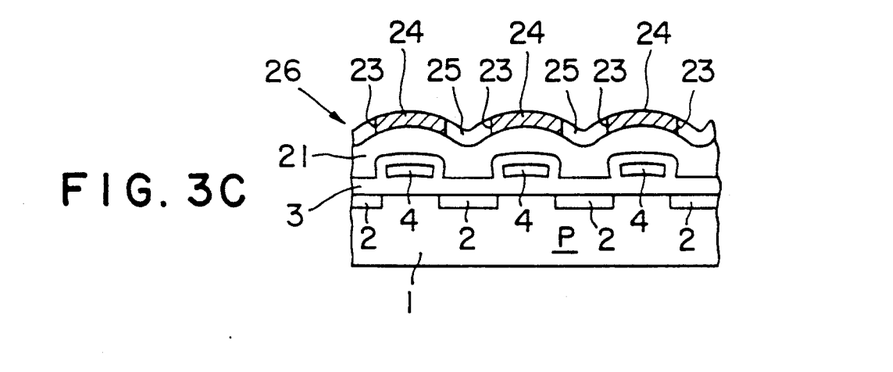
Figure 6:
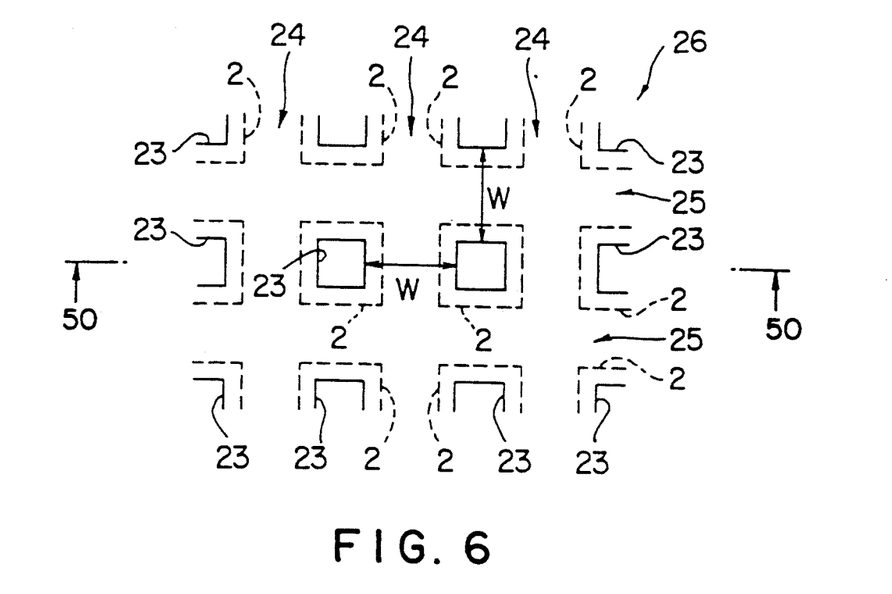
FIG. 6 shows a resist pattern at the intermediate process of manufacturing the image pickup device of the embodiment.

Next, as shown in FIG. 3C, the photoresist layer 22 is patterned to form holes 23, 23, . . . using a photolithography technique. Namely, a resist pattern 26 as particularly shown in FIG. 6, there is formed the resist pattern 26 defining holes 23, 23, . . . and vertical pieces 24, 24, . . . and horizontal pieces 25, 25, . . . surrounding the holes 23, 23, . . . The cross section taken along line b—b of FIG. 6 corresponds to FIG. 3C.

Figure 3D:
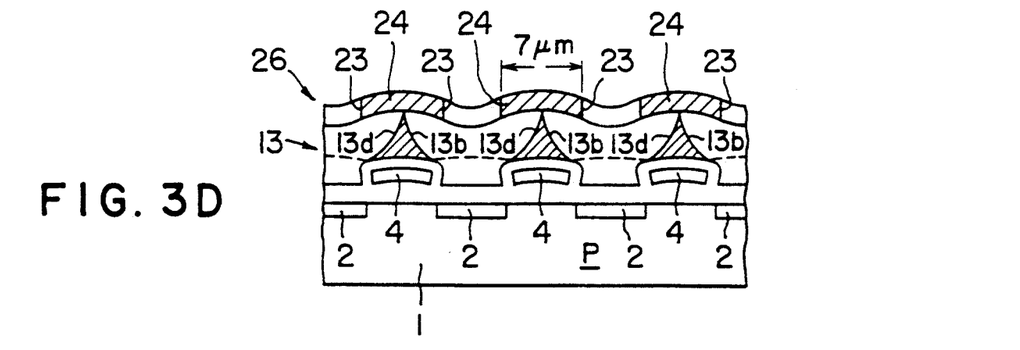

Next, as shown in FIG. 3D, using the resist pattern 26 as a mask, the Al layer 21 is over-etched through wet etching (isotropic etching). Used as an etching liquid is a solution of ($HNO_3 + H_3PO_4 + CH_3COOH$). After this over-etching, the second Al layer 21 is transformed into mirrors 13 shown in FIGS. 3D and 4. The mirrors 13 have, as described previously, vertical elements 14, 14, . . . horizontal elements 15, 15, . . . , and holes 16, 16, . . . The cross section of each element 14, 15 is generally of a wedge shape. The four surfaces 13a to 13d facing each hole 16 constitute a pseudo concave mirror. The mirrors 13 were formed by over-etching for 12 minutes using the etching liquid at temperature of 25° C. and the Al layer 21 having 1% of Si, with the width W of each vertical piece 24 and horizontal piece 25 of the resist pattern 26 being set as 7 μm.

Figure 3E:
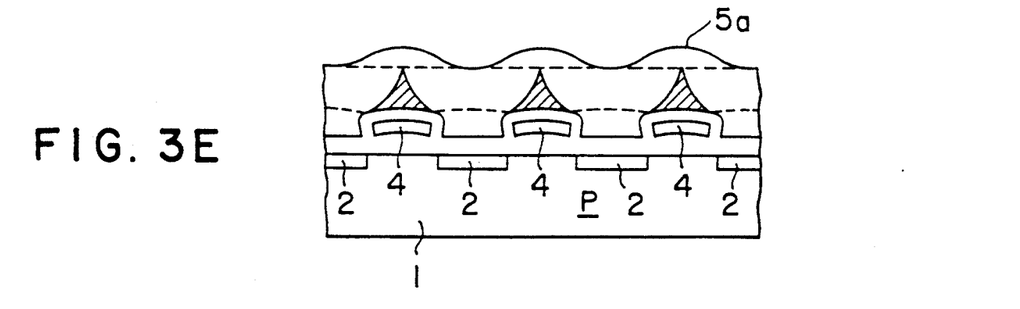

Next, as shown in FIG. 3E, the resist pattern 26 is removed and a protective film 5a is deposited.

Figure 3F:
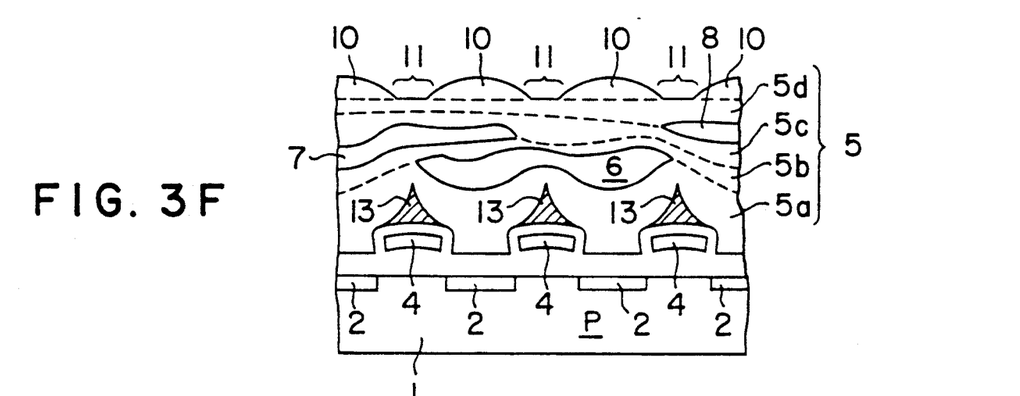

Next, as shown in FIG. 3F, similar to the case of the device shown in FIG. 1, there are formed, on the protective film 5, Ye layers 6, Cy layers 7, Mg layers 8, protective films 5b to 5d, and micro lenses 10, 10, ... In the above manner, the image pickup device shown in FIG. 2 is obtained.

In the above-described processes, wet etching (isotropic etching) is used to obtain mirrors 13 from the Al layer 21. Dry etching (anisotropic etching) may be used instead. Namely, instead of the processes shown in FIGS. 3C and 3D, processes shown in FIGS. 9A and 9B may be used.

Figure 9A:
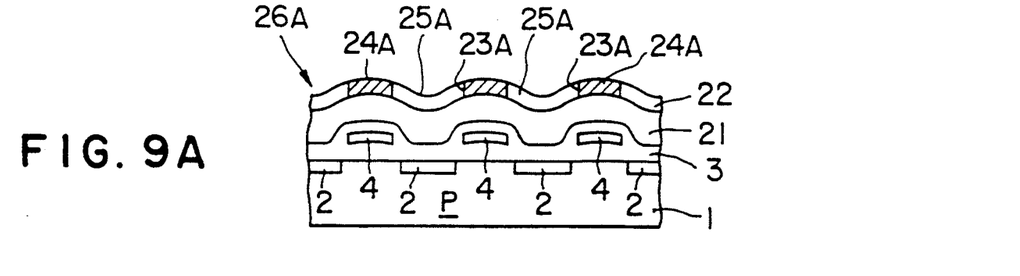
FIGS. 9A to 9C are cross sectional views showing modified processes for manufacturing the image pickup device according to the present invention.

Specifically, after the process shown in FIG. 3B, the resist layer 22 is patterned to obtain a resist pattern 26A having holes 23A, 23A, ..., vertical pieces 24A, 24A, and horizontal pieces 25A, 25A, ... surrounding the holes 23A, 23A, ... as shown in FIG. 9A.

Figure 9B:
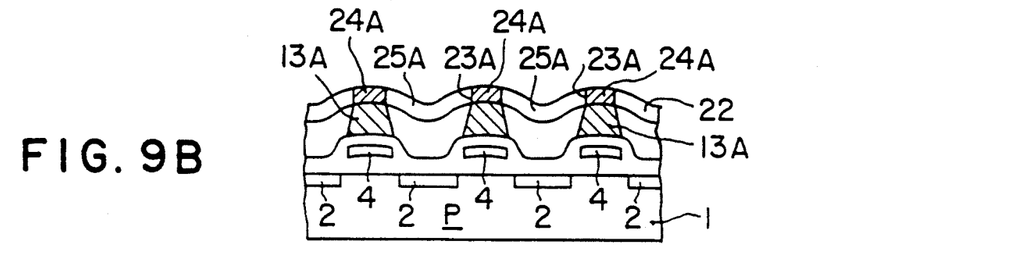
Figure 9C:
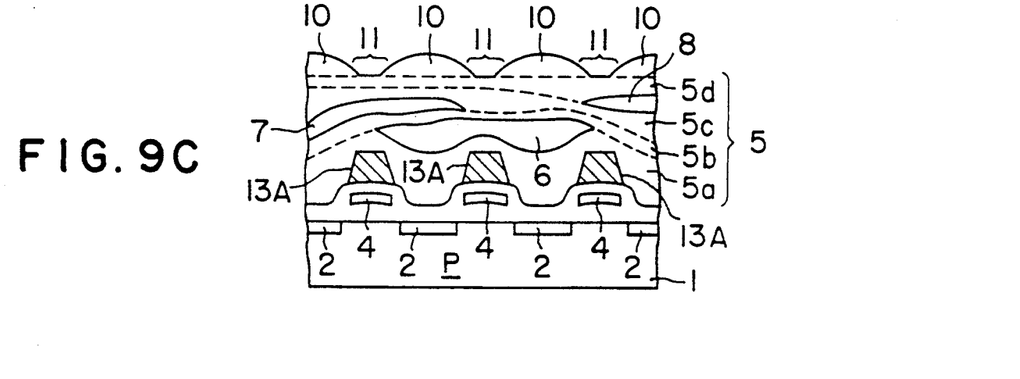

Next, as shown in FIG. 9B, using the resist pattern 26A as a mask, dry etching (anisotropic etching) is carried out. The Al layer 21 is etched to obtain mirrors 13A shown in FIG. 9B, by using (HBr+Cl$_2$) gas and controlling the atmospheric Ar gas pressure and temperature Thereafter, similar processes described with FIGS. 3A to 3F are carried out to obtain the device shown in FIG. 9C.

Figure 7:
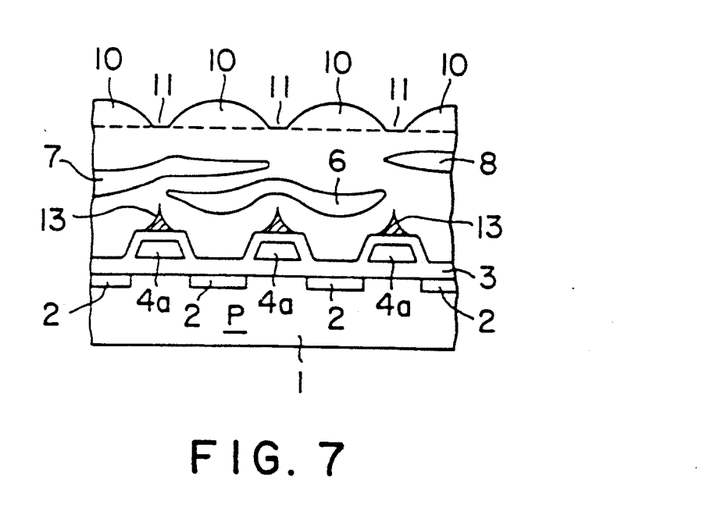
FIG. 7 is a cross sectional view showing the main part of an image pickup device according to another embodiment of the present invention.

FIG. 7 is a cross sectional view showing the image pickup device according to another embodiment of the present invention. A different feature of the device shown in FIG. 7 from that shown in FIG. 2 is that the configuration of each light shielding film 4a made of Al is set to have a mirror surface on side edges thereof. Light beams incident to such non-lens regions 11 are reflected not only by mirrors 13 but also by the side edges (mirror surface) of light shielding films 4a under the mirrors, and become incident to the photodiode 2, thereby improving the light convergence factor.

In order to make the side edges of the light shielding film 4 have a mirror surface, the manufacturing processes described with FIGS. 3A to 3F are applied.

Figure 8A:
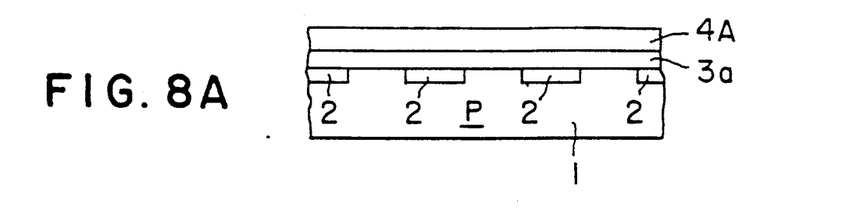
FIGS. 8A to 8D are cross sectional views showing examples of processes for manufacturing the image pickup device of the embodiment.

Specifically, as shown in FIG. 8A, a first Al layer 4A is formed on a protective film 3a.

Figure 8B:
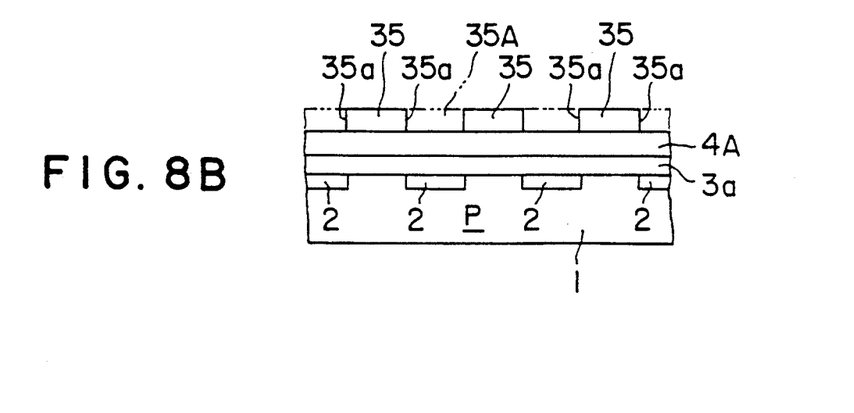

Next, as shown in FIG. 8B, a resist layer 35A is coated on the Al layer 4A. This resist layer 35A is patterned to form a resist pattern 35 which has holes 35a similarly to the pattern shown in FIG. 6.

Figure 8C:
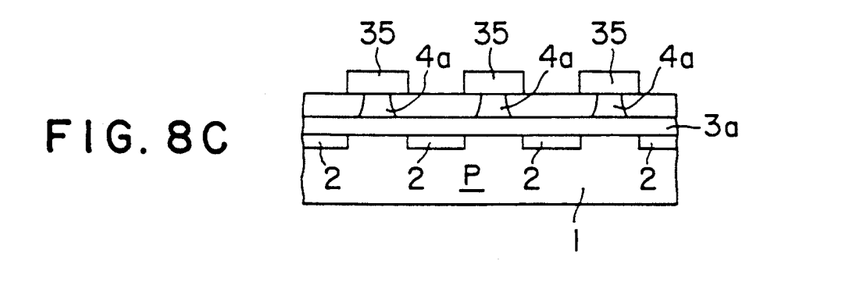

Next, as shown in FIG. 8C, using the resist pattern 35 as a mask, the first Al layer 4A is over-etched using the etching liquid described above to obtain light shielding films 4 whose side edges being formed in pseudo concave surfaces.

Figure 8D:
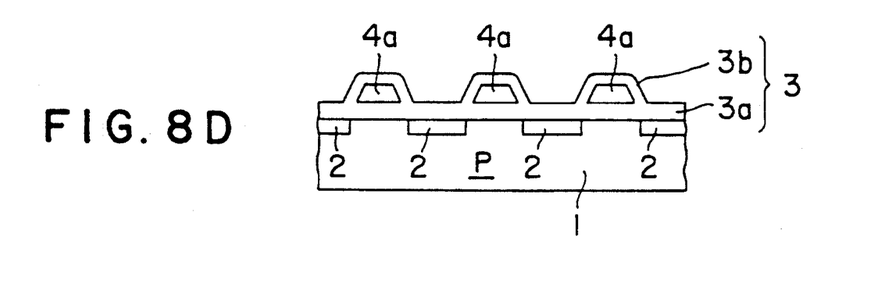

Next, as shown in FIG. 8D, the resist pattern 35 is removed, and a protective film 3b is covered to obtain a protective film 3. Thereafter, the processes shown in FIGS. 3B to 3E are carried out to obtain the device shown in FIG. 7. In the device shown in FIG. 7, the side surfaces of each mirror 13 and the side edges of each light shielding film 4a form large mirror surface (pseudo concave surface).

Figure 10:
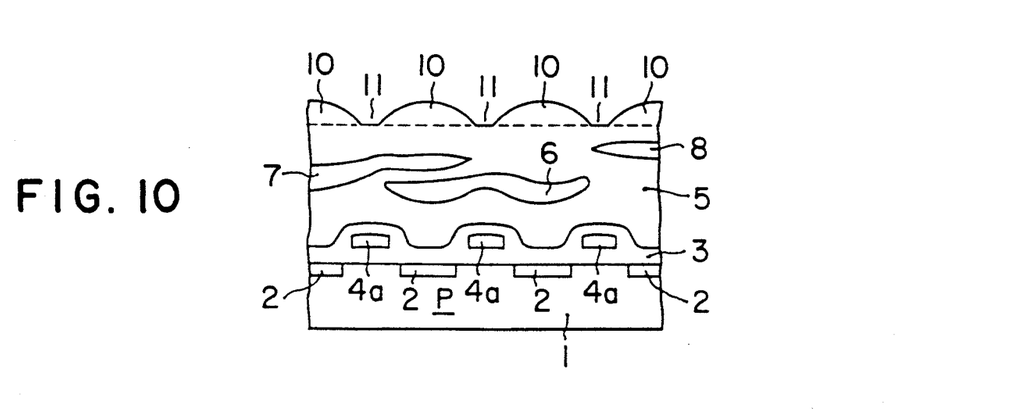
FIG. 10 is a cross sectional view of the image pickup device according to another embodiment.

The mirror 13 may be omitted using only the light shielding film 4a as shown in FIG. 10. In this case, a device having a desired function can be realized by slightly changing the configuration of each light shielding film 4a essential to the device.

Figure 11:
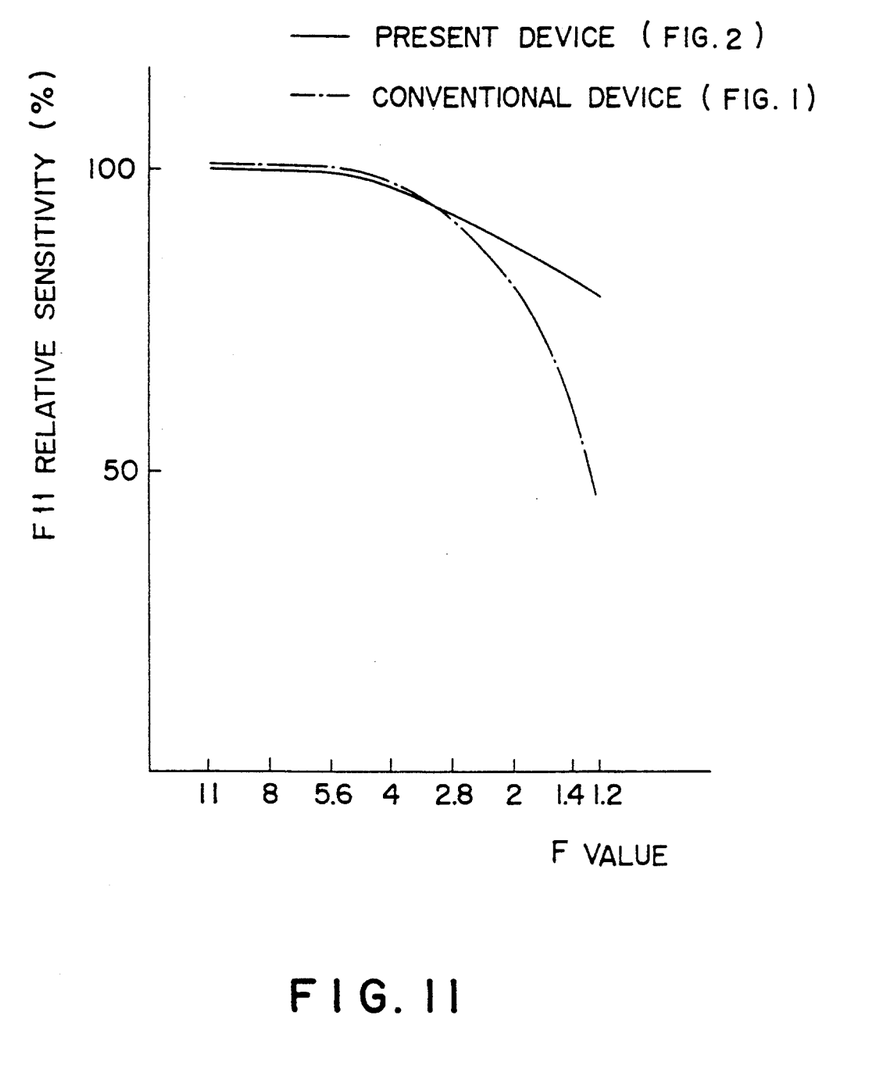
FIG. 11 is a graph explaining the advantageous effects of the present invention.

FIG. 11 is a graph showing the experiment results made by the inventor, evidencing the advantageous effects of the present invention. In the experiments, images are focussed on devices of the present invention shown in FIG. 2 and conventional devices shown in FIG. 1 through a camera lens having respective F values (F f/D; f: focal distance of the lens; D: apperture efficiency) represented on the abscissa, and the sensitivities obtained are represented on the ordinate. As seen from the graph shown in FIG. 11, conventional devices lower its sensitivities greatly as the F value becomes small. According to the present invention, it is understood that even the F value becomes small, the sensitivities are prevented from being lowered considerably.

FIGS. 12A to 12D are cross sectional views showing processes for manufacturing the image pickup device according to another embodiment of the present invention. In the above-described embodiment, mirrors are formed by etching an Al layer. In the embodiment shown in FIGS. 12A to 12D, however, an SiO$_2$/CVD film is etched in the form of mirrors described above, and the surfaces of the mirrors are covered with an Al film.

The method of manufacturing an image pickup device according to this embodiment will be described below with reference to FIGS. 12A to 12D.

Figure 12A:
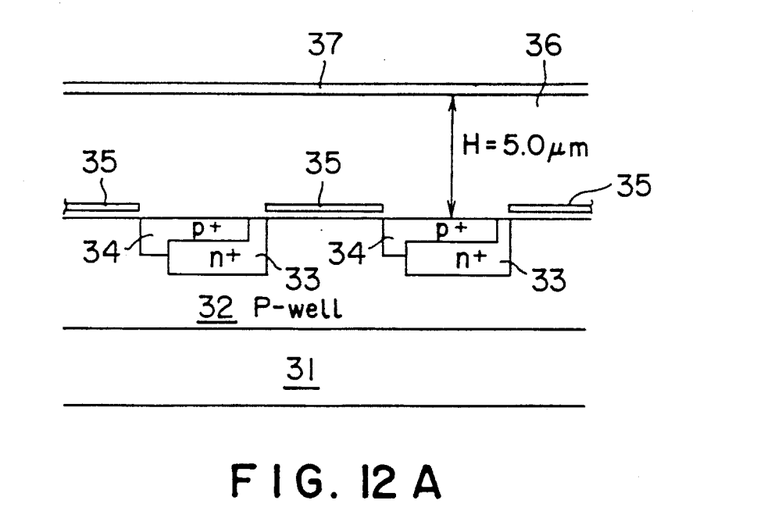
FIGS. 12A to 12D are cross sectional views showing processes for manufacturing the image pickup device according to another embodiment.

As shown in FIG. 12A, a p-well layer 32 is formed on a semiconductor substrate 31. Pairs of an n$^+$layer 33 and a p$^+$layer 34 constituting photosensitive elements are formed on the surface of the well layer 32. Polysilicon films 35 serving as light shielding films are formed on the surface of the well layer 32 at the regions excepting the photosensitive element regions, by means of a general patterning method. On the surface of this intermediate device, there is formed an SiO$_2$ layer 36 having a height of about 5.0 μm, by means of a CVD method. A resist 37 is coated on the SiO$_2$ layer 36.

Figure 12B:
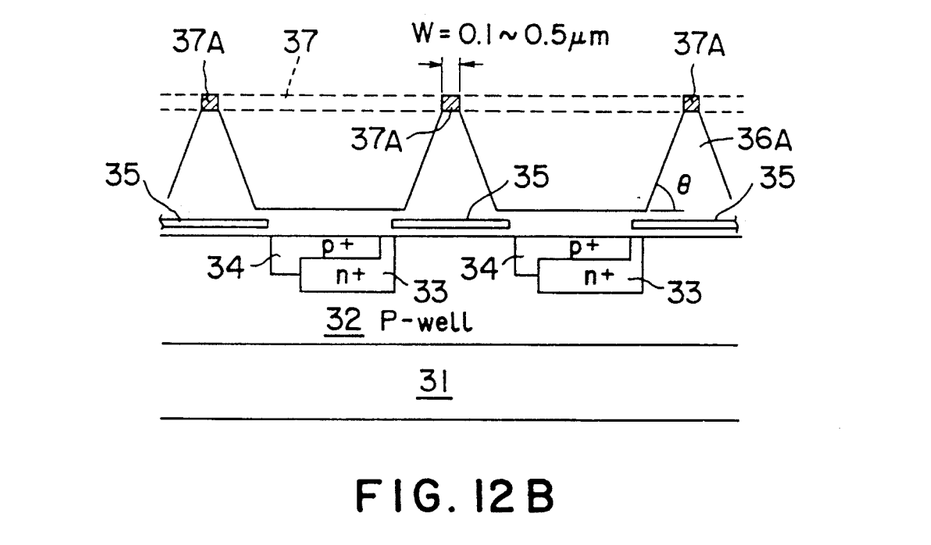

Next, as shown in FIG. 12B, the resist 37 is patterned to form a resist pattern 27A. Using this resist pattern 37A as a mask, the SiO$_2$ layer 36 is etched through an RIE method or a wet etching method using NH$_3$F, to form an SiO$_2$ pattern 36A. The etching angle $\theta$ using the RIE method can be controlled by regulating the condition of gas, and temperature.

Figure 12C:
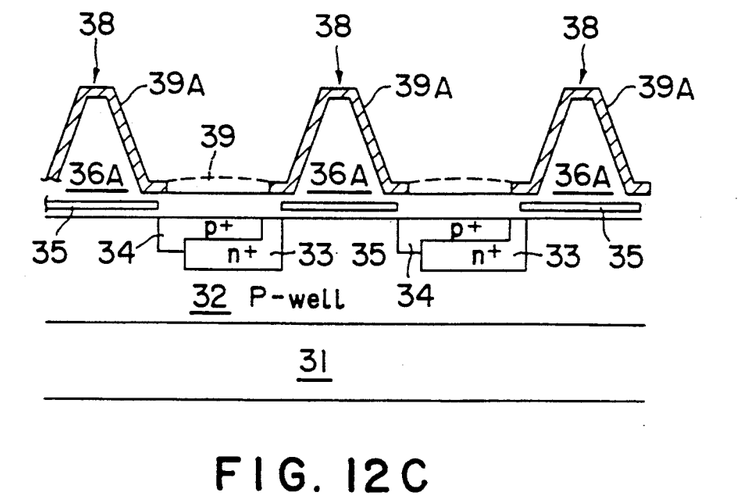

Next, as shown in FIG. 12C, the resist pattern 37A is removed, and an Al film 39 is deposited over the whole surface of the SiO$_2$ pattern 36A by means of sputtering. Thereafter, the Al film 39 is patterned by means of a general lithography technique to remove the Al film 39A on the photosensitive elements (33, 34) and leave the Al filsm 39A on all both sides of wedge-shaped SiO$_2$ patterns 36A, thereby forming mirrors 38.

Figure 12D:
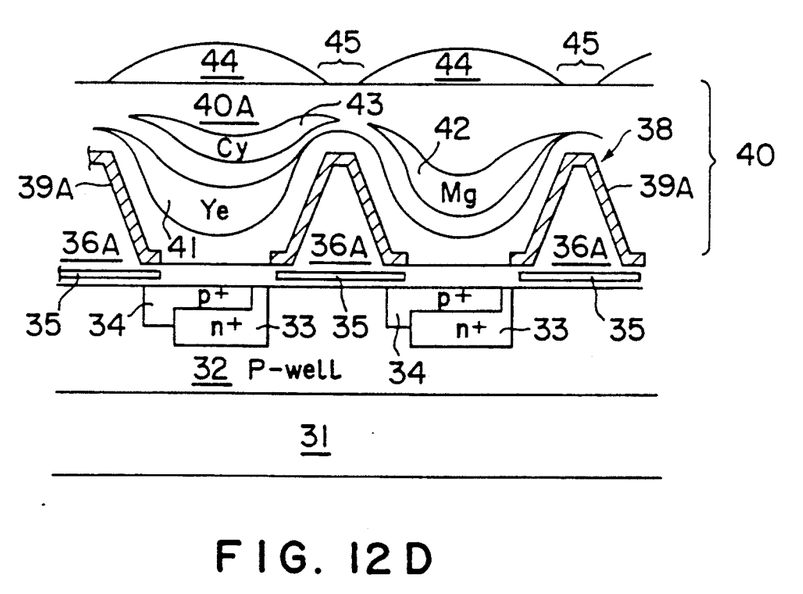

Thereafter, as seen from FIG. 12D, using general processes, there are formed a protective film 40, Ye layers, Mg layers 42, Cy layers 43, smoothing layer 40A, and micro lenses 44. Reference numeral 45 represent a non-lens region.

What is claimed is:

1. A solid state image pickup device, comprising:
   a semiconductor substrate;
   a plurality of photosensitive means formed on the surface of said semiconductor substrate;
   light shielding means positioned above said substrate for covering the regions other than said phtoosensitive means;
   a plurality of light converging means for converging an incident light to each of said photosensitive means, said light converging means defining a plurality of lens regions and being formed above said photosensitive means and above said light shielding means at a predetermined pitch, said pitch defining non-lens region; and reflecting means formed under said non-lens regions and above said light shielding means, said reflecting means having a reflection surface for reflecting a light incident to said converging means and said non-lens regions towards said photosensitive means.

2. A solid state image pickup device, comprising:
a semiconductor substrate;
a plurality of photosensitive means formed on the surface of said semiconductor substrate;
light shielding means positioned above said substrate for covering the regions other than said photosensitive means;
a plurality of light converging means for converging an incident light to each of said photosensitive means, said light converging means defining a plurality of lens regions and being formed above said photosensitive means and above said light shielding means at a predetermined pitch, said pitch defining non-lens regions; and
reflecting means formed under said non-lens regions and above said light shielding means, said reflecting means having a reflection surface for reflecting at least a light incident to said non-lens regions toward said photosensitive means.

3. An image pickup device according to claim 1, wherein each of said reflecting means is configured in a frame, said frame being positioned about an axis perpendicular to said semiconductor substrate and passing through each of said photosensitive means, and the inner surface of said frame constituting a reflection surface for reflecting a light incident to said inner surface toward said photosensitive means.

4. An image pickup device according to claim 2, wherein each of said reflecting means is configured in a frame, said frame being positioned about an axis perpendicular to said semiconductor substrate and passing through each of said photosensitive means, and the inner surface of said frame constituting a reflection surface for reflecting a light incident to said inner surface toward said photosensitive means.

5. An image pickup device according to claim 3, wherein said reflecting means is configured in a rectangular shape.

6. An image pickup device according to claim 4, wherein said reflecting means is configured in a rectangular shape.

7. An image pickup device according to claim 1, wherein said light shielding means has a side reflection surface for reflecting a light incident to said reflection surface toward said photosensitive means.

8. An image pickup device according to claim 2, wherein said light shielding means has a side reflection surface for reflecting a light incident to said reflection surface toward said photosensitive means.

9. An image pickup device according to claim 1, wherein said reflecting means is made of aluminum and obtained by etching an aluminum film covered over the whole surface above said light shielding means.

10. An image pickup device according to claim 2, wherein said reflecting means is made of aluminum and obtained by etching an aluminum film covered over the whole surface above said light shielding means.

11. An image pickup device according to claim 3, wherein said reflecting means is made of aluminum and obtained by etching an aluminum film covered over the whole surface above said light shielding means.

12. An image pickup device according to claim 4, wherein said reflecting means is made of aluminum and obtained by etching an aluminum film covered over the whole surface above said light shielding means.

13. An image pickup device according to claim 1, wherein said reflecting means is made of aluminum and obtained by etching an insulating film covered over the whole surface above said light shielding means and partially depositing an aluminum film on said insulating film.

14. An image pickup device according to claim 2, wherein said reflecting means is made of aluminum and obtained by etching an insulating film covered over the whole surface above said light shielding means and partially depositing an aluminum film on said insulating film.

15. An image pickup device according to claim 3, wherein said reflecting means is made of aluminum and obtained by etching an insulating film covered over the whole surface above said light shielding means and partially depositing an aluminum film on said insulating film.

16. An image pickup device according to claim 4, wherein said reflecting means is made of aluminum and obtained by etching an insulating film covered over the whole surface above said light shielding means and partially depositing an aluminum film on said insulating film.

17. An image pickup device according to claim 1, wherein said light shielding means and said reflecting means are formed integrally.

18. An image pickup device according to claim 2, wherein said light shielding means and said reflecting means are formed integrally.

19. An image pickup device according to claim 1, further comprising color filter means disposed between said reflecting means and said light converging means, said color filter means filters said incident light by only passing light having a predetermined wavelength.

20. An image pickup device according to claim 2, further comprising color filter means disposed between said reflecting means and said light converging means, said color filter means filters said incident light by only passing light having a predetermined wavelength.

21. An image pickup device according to claim 3, further comprising color filter means disposed between said reflecting means and said light converging means, said color filter means filters said incident light by only passing light having a predetermined wavelength.

22. An image pickup device according to claim 4, further comprising color filter means disposed between said reflecting means sand said light converging means, said color filter means filters said incident light by only passing light having a predetermined wavelength.

* * * * *